United States Patent
Yu (12)

(10) Patent No.: US 6,211,805 B1
(45) Date of Patent: Apr. 3, 2001

(54) NOISE SHAPING DYNAMIC ELEMENT MISMATCH IN ANALOG TO DIGITAL CONVERTERS

(75) Inventor: Paul C. Yu, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/392,138

(22) Filed: Sep. 8, 1999

(51) Int. Cl.[7] .............................. H03M 1/66; H03M 1/12; H03M 1/38
(52) U.S. Cl. ........................... 341/155; 341/161; 341/144
(58) Field of Search ..................................... 341/155, 143, 341/118, 139, 120, 156, 161, 150, 172, 144

(56) References Cited

U.S. PATENT DOCUMENTS

| | | |
|---|---|---|
| 5,404,142 | 4/1995 | Adams et al. . |
| 5,412,387 | 5/1995 | Vincelette et al. . |
| 5,416,485 | 5/1995 | Lee . |
| 5,594,445 | 1/1997 | Ginetti . |
| 5,764,176 | 6/1998 | Ginetti . |
| 6,031,480 | * 2/2000 | Soenen et al. ...................... 341/161 |

OTHER PUBLICATIONS

A. Shabra et al., "Oversampled Pipeline A/D Converters with Mismatch Sampling," IEE, Electronic Letters, vol. 34, Issue 6, pp. 508–509, Mar. 19, 1998.

Ning He et al., "Double–Loop Sigma–Delta Modulation with dc Input," IEEE Trans. Commun., vol. COM–38, pp. 487–495, Apr. 1990.

Bang–Sup Song et al., "A 12–Bit 1–Msample/s Capacitor Error–Averaging Pipelined A/D Converter," IEEE Journal of Solid–State Circuits, vol. 23, No. 6, pp. 1324–1333, Dec. 1998.

Todd L. Brooks et al., "A 16b ΣΔ Pipeline ADC with 2.5 MHz Output Data–Rate," IEEE International Solid State Circuits Conference, pp. 208–209, 458, Feb. 7, 1997.

Paul C. Yu et al. "A Pipelined A/D Conversion Technique with Near–Inherent Monotonicity," IEEE Transactions on Circuits and Systems—II: Analog and Digital Signal Processing, vol. 42, No. 7, pp. 500–502, Jul. 1995.

Ping Wai Li et al., "A Ratio–Independent Algorithmic Analog–to–Digital Conversion Technique," IEEE Journal of Solid–State Circuits, vol. SC–19, No. 6, pp. 828–836, Dec. 1984.

(List continued on next page.)

*Primary Examiner*—Patrick Wamsley
(74) *Attorney, Agent, or Firm*—J. Dennis Moore; Wade James Brady, III; Frederick J. Telecky, Jr.

(57) ABSTRACT

A method for shuffling capacitors from period to sample period in a stage of a multi-stage analog to digital converter ("ADC"). The ADC stage includes a plurality of capacitors usable for storage of charge during a sample phase and for providing during an amplification phase, in conjunction with an amplifier, an output signal having a voltage representing the difference between the digital output voltage level for the stage and the analog input voltage level for the stage. The method includes the following steps. First, the input is provided to the plurality of capacitors during the sample phase to capture and hold the first analog voltage level at a first time in the sample phase. Then, a selected sub-group of the plurality of capacitors is used as feedback capacitors, while a remaining sub-group of the plurality of capacitors is used as digital to analog subconverter ("DASC") capacitors, in conjunction with the amplifier, the selected sub-group and the remaining sub-group being different sets in adjacent sample periods. The selection of capacitors is performed in accordance with a predetermined capacitor shuffling procedure adapted to convert resulting harmonic distortion associated with capacitor mismatch into noise having a spectral amplitude peak placed outside of a predetermined spectral band.

10 Claims, 5 Drawing Sheets

OTHER PUBLICATIONS

Cheng–Chung Shih et al., "Reference Refreshing Cyclic Analog–to–Digital and Digital–to–Analog Converters," IEEE Journal of Solid–State Circuits, vol. SC–21, No. 4, pp. 544–554, Aug. 1986.

Rex T. Baird and Terri S. Fiez, "Improved ΔΣ DAC Linearity Using Data Weighted Averaging" IEEE Int. Symp. Circuits Sys., vol. 1, pp. 13–16, May 1995.

Feng Chen and Bosco H. Leung, "A High Resolution Multibit Sigma–Delta Modulator with Individual Level Averaging" IEEE Journal of Solid–State Circuits, vol. 30, No. 4, pp. 453–460, Apr. 1995.

Bosco H. Leung and Sehat Sutarja, "Multibit Σ–Δ A/D Converter Incorporating a Novel Class of Dynamic Element Matching Techniques" IEEE Transactions on Circuits and Systems—II: Analog and Digital Signal Processing, vol. 39, No. 1, pp. 35–51, Jan. 1992.

L. Richard Carley, "A Noise–Shaping Coder Topology for 15+ Bit Converters" IEEE Journal of Solid–State Circuits, vol. 24, No. 2, pp. 267–273, Apr. 1989.

Louis A. Williams, III "An Audio DAC with 90dB Linearity Using MOS to Metal–Metal Charge Transfer" ISSCC Dig. Tech. Papers, pp. 58–59, San Francisco 1998.

* cited by examiner

NOISE SHAPING DYNAMIC ELEMENT MISMATCH IN ANALOG TO DIGITAL CONVERTERS

TECHNICAL FIELD OF THE INVENTION

The present invention relates to analog to digital converter (hereinafter "ADC") systems and, more particularly, to a method and apparatus for converting element mismatch into white noise in such systems.

BACKGROUND OF THE INVENTION

Multi-bit per stage, pipelined ADCs are known apparatus for providing a stream of multi-bit, digital codes, or words, representing an analog signal for a succession of sample periods. Each word represents a value corresponding to the magnitude of some attribute of the analog signal at each of a corresponding succession of sample times, for example the voltage of the analog signal. Each sample period, during which a sample time occurs, is divided into a first, sample phase and a second, amplification phase. By way of background, it is useful to review the construction of a conventional multi-bit per stage, pipelined ADC. Such an ADC is shown in FIG. 1. Four stages 12, 14, 16, 18 are shown; however, as shown by ellipsis 20, further stages may be included. An analog input signal $V_{IN}$ is provided on line 22 to stage one 12. A first residual signal $V_{RES1}$ is provided on line 24 from stage one 12 to stage two 14. A second residual signal $V_{RES2}$ is provided on line 26 from stage two 14 to stage three 16. A third residual signal $V_{RES3}$ is provided on line 28 from stage three 16 to stage four 18. A further residual signal is provided from stage four 18 on line 30, and so forth.

Typically, all of the stages of a pipelined ADC such as ADC 10 are the same. In FIG. 1, the functional components of stage two 14 are shown by way of example. Thus, referring to the blowup 15 of stage two 14, input line 24 can be seen, which is an input to sample and hold amplifier ("SHA") 32. The output of SHA 32 is provided on line 34 to an m-bit analog-to-digital subconverter (ADSC) 36, which is typically a flash ADC, and to a first input of a summing unit 38. The output of m-bit ADSC 36 is an m-bit sub-word, which is provided on line 40 both as an output to stage two 14 and is provided as an input to m-bit digital-to-analog subconverter (DASC) 42. The output of m-bit DASC 42 is provided on line 44 to a subtracting input to summing unit 38. The output of summing unit 38 is provided on line 46 to a $2^m$ amplifier 48, which has a theoretical gain of $2^m$. The output of $2^m$ amplifier 48 is provided on line 26.

In operation, stage two 14 operates as follows. An analog signal is provided on line 24 to SHA 32. SHA 32 samples the analog signal on line 24 at a succession of times and holds each such sample as a signal level on line 34 for a time sufficient to permit m-bit ADSC 36 to sense the level of the signal on line 34 and provided a digital representation thereof, as a sub-word of m-bits, on line 40. Those m-bits are converted to an analog voltage signal by m-bit DASC 42, and provided on line 44. The analog signal on line 44 has a voltage level that corresponds to the analog signal on line 24, but only to the digital accuracy determined by the number of bits, m, on line 40. The voltage of the analog signal on line 44 is subtracted from the voltage of the input signal on line 34 by summing unit 38, and the difference signal is provided on line 46 to amplifier 48, where it is amplified by a factor of $2^m$. The voltage of the difference signal on line 46 represents the negative of the error made by the m-bit ADSC 36. Theoretically, that error signal represents the inaccuracy of the m-bit representation of the analog signal on line 24 due to the limited number of bits. That error signal, amplified by $2^m$, is input to the following stage of the pipeline via line 26, where a similar set of operations is performed.

After the signal propagates through n stages, a digital sample of the input signal $V_{IN}$ is obtained. Each of the sub-word bit lines provided at the output of the respective stage's ADSC, e.g., bit lines 40 from ADSC 36, contributes to the overall digital word which is the digital representation provided by ADC 10 of the sampled signal $V_{IN}$. The sub-word bit lines are concatenated to form this word. A new word is generated for each time period for which a sample is taken in the sample and hold amplifiers, e.g., SHA 32.

In a conventional pipelined ADC, there are three main error sources. The first is the A/D subconverter linearity in the form of comparator offsets. Provided that the DASC and the interstage gain are perfect, this error can typically be removed by using digital error correction. The remaining two error sources are the D/A subconverter and the interstage gain error, both of which occur if the capacitors are not perfectly matched.

In Σ-Δ ADCs, capacitor mismatch results in DASC errors only. This DASC error can be reduced by using a number of dynamic element matching ("DEM") techniques previously proposed for linearizing the DASC in multi-bit Σ-Δ ADCs. Examples of such techniques are described in L. R. Carley, "Noise Shaping Coder Typology for 15-bit Converters," *IEEE J. Solid-State Circuits*, S.C. 24 No. 2, pp. 267–273, April 1989; B. H. Leung and S. Sutarja, "Multibit Σ-Δ A/D Converter Incorporating a Novel Class of Dynamic Element Matching Techniques," *IEEE Trans. Circuits and Syst. II*, Vol. 39, No. 1, pp. 35–51, January 1992; R. T. Baird and T. Fiez, "Improved Σ-Δ DAC Linearity Using Data Weighted Averaging," *Proc. 1995 IEEE Int. Symp. Circuits Sys.*, Vol. 1, pp. 13–16, May 1995; and R. Adams and T. Kuan, "Data-Directed Scrambler for Multi-Bit Noise Shaping D/A Converters," U.S. Pat. No. 5,404,142, Assigned to Analog Devices, Inc., Apr. 4, 1995. By using a time varying combination of elements to represent the given DASC output level, the element mismatch errors are averaged out over time, thereby linearizing the DASC.

Finally, techniques were proposed by L. Hernandez, in "Digital Implementation of Mismatch Shaping in over-sampled pipeline A/D converters," *IEE Electronics Letters*, Vol. 34, No. 7, Apr. 2, 1998, and by A. Shabra, et al., in "Oversampled Pipeline A/D Converters with Mismatch Shaping," *IEE, Electronics Letters* Vol. 34, Issue 6, Mar. 19, 1998, that exploits mismatch shaping in pipeline converters. It uses a commutative feedback capacitor scheme with two capacitors. However, this technique is limited to two capacitors, and requires special digital error correction techniques involving over-ranging and under-ranging stages in the pipeline.

In a pipelined ADC, capacitor mismatch results in both DASC and interstage gain error. Direct application of existing DEM techniques to pipelined ADCs is not very effective since the interstage gain error can still degrade the overall linearity of the pipeline significantly. Therefore, it is an object of the invention to provide a solution to the problem of interstage gain error in multi-bit per stage pipelined ADCs. It is also an object of the invention to provide a solution to the problem of capacitor mismatch error in a DASC in an ADC, in addition to the problem of interstage gain error. It is also an object of the present invention to reduce such errors, while maintaining sufficient simplicity in the overall ADC design so as to permit a commercially viable product including such an ADC.

SUMMARY OF THE INVENTION

According to the present invention, there is provided a method for shuffling capacitors from sample period to sample period in a stage of a multistage analog to digital converter ("ADC"), the ADC stage receiving for each sample period an input having a first analog voltage level, and providing for each sample period a digital output representing a second voltage level corresponding to the first analog voltage level to a predetermined digital accuracy, as well as providing an analog output representative of the difference between the first analog voltage level and a second analog voltage level corresponding to the digital output. The ADC stage includes a plurality of capacitors usable for storage of charge during a sample phase and for providing during an amplification phase, in conjunction with an amplifier, an output signal having a voltage representing the difference between the second analog voltage level and the first analog voltage level. The method includes the following steps. First, the input is provided to the plurality of capacitors during the sample phase to capture and hold the first analog voltage level at a first time in the sample phase. Then, a selected sub-group of the plurality of capacitors is used as feedback capacitors, while a remaining sub-group of the plurality of capacitors is used as digital to analog subconverter ("DASC") capacitors, in conjunction with the amplifier, the selected sub-group and the remaining sub-group being different sets in adjacent sample periods. The selection of capacitors is performed in accordance with a predetermined capacitor shuffling procedure adapted to convert resulting harmonic distortion associated with capacitor mismatch into noise having a spectral amplitude peak placed outside of a predetermined spectral band.

These and other features of the invention will be apparent to those skilled in the art from the following detailed description of the invention, taken together with the accompanying drawings.

DESCRIPTION OF PREFERRED EMBODIMENTS OF THE PRESENT INVENTION

Figure 1:
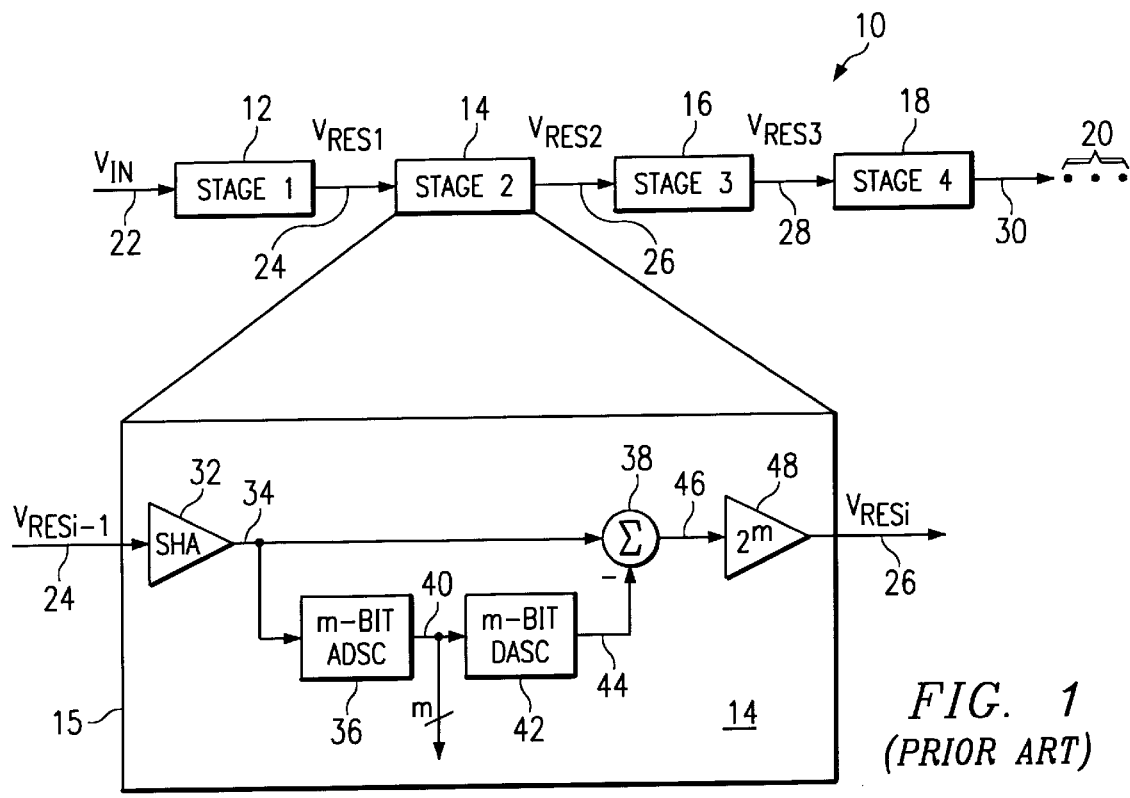
FIG. 1 is a block diagram of a prior art analog to digital converter.
Figure 2:
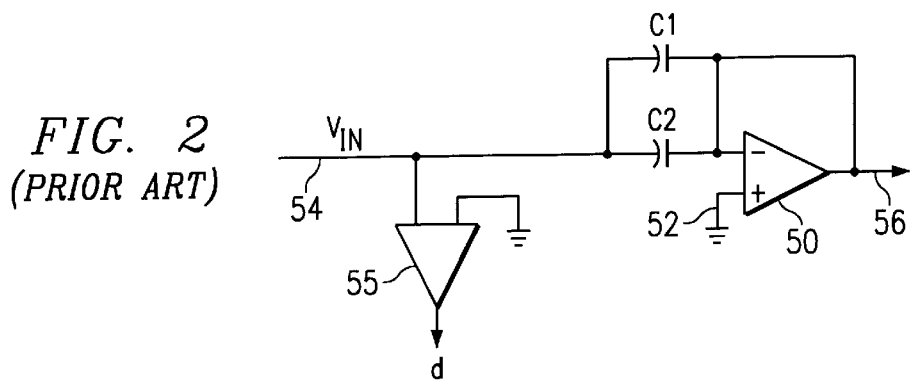
FIG. 2 is a circuit diagram of a pertinent portion of a prior art sample and hold amplifier in a first phase configuration.

FIG. 2 is a circuit diagram of pertinent portions of a 1.5 bit ADC stage of a first type, such as ADC stage 14 of FIG. 1, configured in a first, sample phase, for use in accordance with a method of a preferred embodiment of the present invention. This first category type of ADC stage architecture is of the type in which the number of capacitors is $2^{(m-1)}$, the number of feedback capacitors is 1, and the number of comparators is $2^m-2$. In such type architectures the number of DAC reference levels is 3. In the circuit of FIG. 2, the value m is 2. The principles of the present invention involved in explaining its operation are equally applicable to circuits in which m takes other values. The designer need merely scale appropriately. It will be appreciated that the principles of the present invention are applicable as well to other architectures, for example ADC stages of the type in which the number of capacitors is $2^m$, the number of feedback capacitors is 2, and the number of comparators is $2^m-1$. In such type architectures the number of DAC reference levels is 2. Again, the principles of the present invention apply as well to such architecture types, as will be readily apparent to those of ordinary skill in the art area to which the invention pertains, once the principles of the present invention, as set forth herein, are understood.

In the circuit of FIG. 2 is a differential amplifier 50, having its non-inverting input connected to ground via a line 52. An input signal having a voltage $V_{IN}$ is provided on an input line 54 to a pair of capacitors, capacitor C1 and capacitor C2, connected in parallel between input line 54 and an inverting input of differential amplifier 50. The inverting input and output of differential amplifier 50 are connected during this phase, as shown by closed switch $S_S$. This provides a virtual ground connection for capacitors C1 and C2, so that they can charge up during the sample phase, and capture the sampled voltage $V_{IN}$ at the sample time. At the end of the sample phase, typically on the falling edge of the clock cycle controlling the sample phase, switch $S_S$ is opened, capturing and holding that charge for use in the next, amplifying phase. It will be appreciated that other circuits and architectures may be used in which capacitors C1 and C2 or similar capacitors for such circuits or architectures, may be connected to an AC ground node, or even to DC ground.

Input line 54 is also connected to an input of a comparator 55, the other input of which is connected via line 56 to ground. The result, d, of a comparison of comparator 56 is provided at the output 57 of comparator 55. The value d may be 1, 0 or −1, depending on the value of $V_{IN}$. The value of d is used to generate the m-bit sub-word, which is the output of the ADC stage. In the configuration shown in FIG. 2, m is equal to two.

Figure 3:
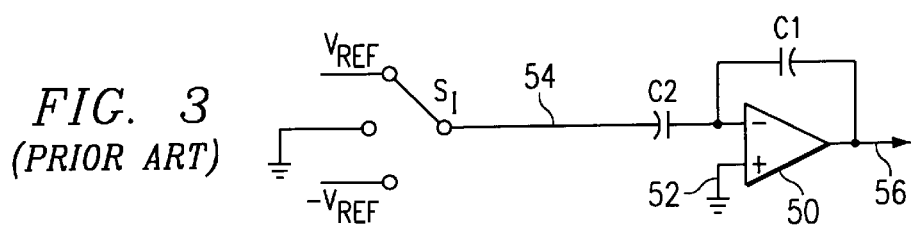
FIG. 3 is a circuit diagram of a pertinent portion of a prior art sample and hold amplifier in a second phase configuration.

FIG. 3 shows the same circuit components shown in FIG. 2 of an ADC stage, as configured in a second, hold, or, amplifying phase. As can be seen, in this second, amplifying phase, input line 54 is now connected to a voltage reference at a level of d·$V_{REF}$, where, again, d is either 1, 0, or −1, depending on the output of comparator 55, as shown by switch $S_A$. Capacitor C2 remains connected between input line 54 and the negative input of differential amplifier 50 and operates as a DASC capacitor. However, capacitor C1 has its port previously connected to input line 54 now connected to the output line 58, replacing the circuit path including switch $S_S$ in FIG. 2, and operates as a feedback capacitor.

Figure 4A:
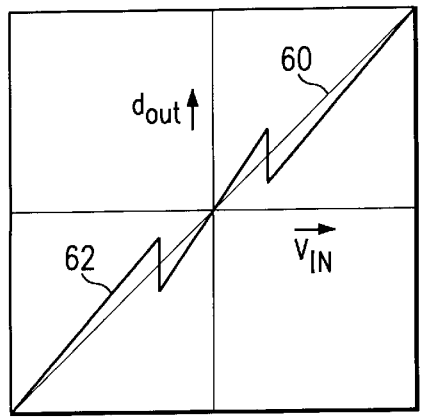
FIG. 4(A) is a graph showing a transfer curve for a 1.5 bit per stage pipelined A/D converter stage, for a first configuration of a two capacitor sample and hold amplifier.
Figure 4B:
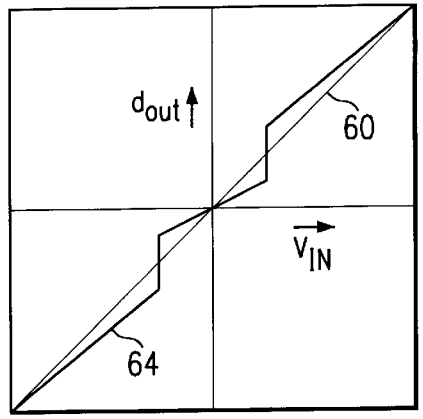
FIG. 4(B) is a graph showing a transfer curve for a 1.5 bit per stage pipelined A/D converter stage, for a second configuration of a two capacitor sample and hold amplifier.

In conventional 1.5 bit per stage pipelined ADCs, capacitor C1 is always utilized as the feedback capacitor, while capacitor C2 is always utilized as the input connection capacitor. FIGS. 4a and 4b show a consequence of this approach. FIG. 4a and FIG. 4b are graphs of the input voltage versus the output voltage of the sample and hold amplifier of FIGS. 2 and 3, i.e., the effective transfer curve of that unit, for two cases. In FIG. 4a a curve 62 is shown for the transfer curve in the case where C1<C2. In FIG. 4b a curve 64 is shown for the transfer curve in the case where C1>C2. The ideal transfer curve is shown by a line 60 in both FIG. 4a and FIG. 4b. In the prior art, the value of C1 vs. C2 is fixed once the chip is fabricated. Therefore, in operation the ADC will have a transfer curve like curve 62, or curve 64, all the time.

In accordance with the principles of the present invention, C1 is selected as the feedback capacitor by a procedure, described in detail below, on average the same number of times as C2. By selecting C1 (FIGS. 2, 3) as the feedback capacitor on average the same number of times as C2, the effective transfer curve is a time averaged version of curves 62 and 64. This effective curve approaches the ideal curve 60. As a result, the ADC is linearized. Further, by switching from transfer curve 62 to transfer curve 64 in accordance with such procedure, i.e., selecting C1 or C2 as the feedback capacitor in accordance with such procedure, then noise shaped element mismatch is achieved. Further, this approach not only applies to 1.5 bit/stage as explained above, but can be generalized to multibit per stage architectures.

While the schemes proposed in the articles to L. Hernandez and to A. Shabra, et al., provide improvement, nonetheless the improvement is limited in pipelined ADCs. Those techniques are constrained to the use of two capacitors in the sample and hold amplifier, placing a limitation on the improvement in overall distortion. In addition, non-standard digital error correction must be employed when using such schemes.

In accordance with the principles of the present invention capacitor shuffling is accomplished that provides a noise shaped element mismatch. In addition, at the same time, the capacitor shuffling of the present invention noise shapes interstage gain error.

Figure 5:
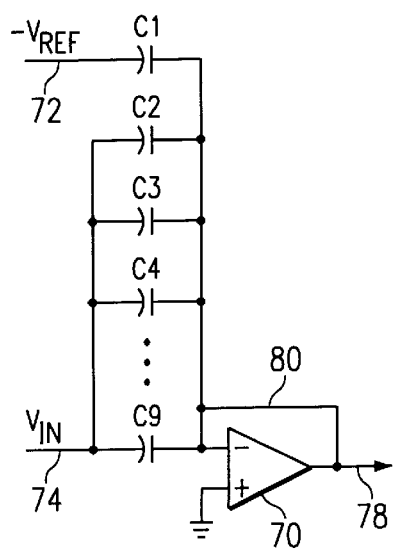
FIG. 5 is a circuit diagram of a sample and hold amplifier according to the preferred embodiment of the present invention, in a first configuration.

FIG. 5 is a circuit diagram of pertinent portions of an ADC stage, shown in the sampling phase, for use in accordance with a preferred embodiment of method of the present invention. A comparator generating a value d used to generate an m-bit sub-word is omitted from the diagram, in the interest of brevity, but it will be understood that such component exists in actual implementations. In the circuit of FIG. 5 is a differential amplifier 70, having a non-inverting input connected to ground by way of a line 72. An input line 74 provides an input voltage $V_{IN}$ to two sets of capacitors, a first set C11, C12, . . . , C1q, and a second set of capacitors C21, C22, . . . , C2p, all of which capacitors are connected in parallel between the input line 74 and an inverting input of amplifier 70. The inverting input of amplifier 70 is also connected by way of a switch $S_S'$ to the output of amplifier 70, line 76, in accordance with similar principles as those discussed above with reference to switch $S_S$ in FIG. 2. Thus, switch $S_S'$ provides a virtual ground connection for capacitors C11, C12, . . . , C1q, and capacitors C21, C22, . . . , C2p, so that they can charge up during the sample phase, and capture the sampled voltage $V_{IN}$ at the sample time. As in FIG. 2, switch $S_S'$ is opened at the end of the sample phase to capture that charge for use in the next, amplifying phase.

Figure 6:
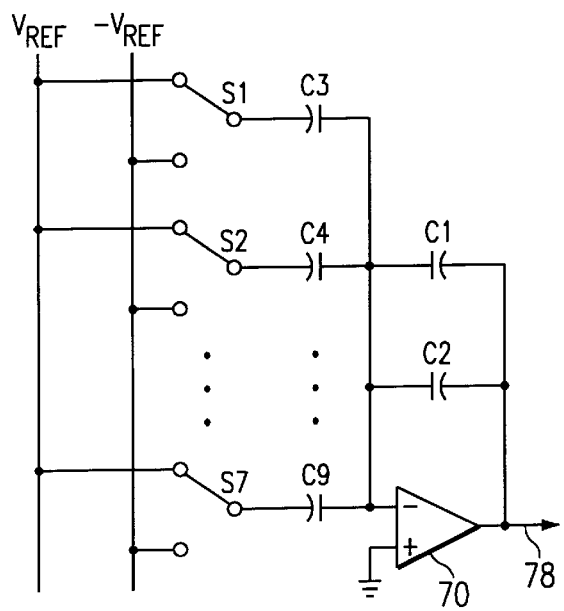
FIG. 6 is a circuit diagram of a sample and hold amplifier according to the preferred embodiment of the present invention, in a second configuration.

FIG. 6 is a circuit diagram of the circuit of FIG. 5, as configured in a second phase, that of amplification. As can be seen, in FIG. 6 the capacitors in the first group, C11, C12, . . . C1q, are now connected all in parallel as feedback capacitors between the output line 76 and the inverting input of amplifier 70. The capacitors in the second group, C21, C22, . . . C2p, are now all connected in parallel together as DASC capacitors between the negative input of amplifier 70 and to a respective one of a corresponding number of switches S1, S2, . . . Sp. Each of these switches, S1, S2, . . . Sp, allows the port of its respective DASC capacitor to be connected to $V_{REF}$, ground, or −$V_{REF}$, depending upon the position of the switch, which, again is determined by the value d output by the comparator (not shown).

During the sampling phase, as shown in FIG. 5, no changes are necessary from the conventional approach. During the amplifying phase in a conventional pipeline, the connection of the DASC capacitors are fixed once the digital code from the ADSC is determined. In addition, the feedback capacitor is usually predetermined to be C11 for all time. However, in a preferred embodiment of the present invention, the connections of the DASC capacitors to $V_{REF}$, GND, and −$V_{REF}$ are shuffled by a procedure that provides a noise shaped element mismatch, and a noise shaped interstage gain error.

It should be understood that the numbers p and q are selectable, depending upon the performance desired versus the chip area to be occupied by the sample and hold amplifier. Out of the p number of unit capacitors, depending on the digital decisions, a selectable number i of them may be connected to $V_{REF}$, j of them to −$V_{REF}$, and k of them to GND. Over time, however, part or all of the q feedback capacitors may be used as the DASC capacitor, and vice versa.

For instance, consider the case where the number of bits per stage is three. One conventional architecture uses four capacitors per stage, with p being three and q being one. Thus, the three DASC capacitors are C21, C22 and C23, which are denominated C2, C3 and C4 in the discussion that follows, while C11 is the feedback capacitor, which is denominated C1 in the discussion that follows.

Suppose, in this case, that the analog input is such that the ADSC output is two. In a conventional pipeline, C2, as part of the DASC capacitors, is always selected to connect to −$V_{REF}$, while C3 and C4 are connected to GND. Using the technique of this preferred embodiment, however, C1 through C4 are selected according to the aforementioned shuffling procedure to connect to $-V_{REF}$. At the same time, the two connections to GND and the feedback capacitor are all chosen by the procedure as well. By utilizing the appropriate shuffling procedure, as will be described in detail below, the harmonic distortion usually associated with capacitor mismatch is converted into noise that may have its spectral amplitude shaped so as to have a peak, or maximum, that may be placed substantially outside of the band of interest for the particular application.

In conventional architectures, the number of feedback capacitors, q, is usually one or two. The approach taken in the preferred embodiments can accommodate this and still achieve the desired noise shaping. This is done by shuffling the connections of all of the capacitors, including the feedback capacitors, as described herein.

According to a first preferred embodiment, a methodology is provided that causes an individual level averaging type noise shaping. In application of the inventive techniques, the switching of switches S1, S2, . . . S7, is controlled in dependence on the digital output of the m-bit ADSC 36, on line 40 (FIG. 1) for the previous sample time.

The preferred embodiments of the method of the present invention will be explained by reference to FIGS. 7 through 15. These figures are block diagrams of pertinent portions of arrangements in which these methods are practiced. The block diagrams include elements U, such as capacitors, that are shuffled in accordance with these methods. Also included in these block diagrams are registers R where values are stored that are used to determine the particular pattern of shuffling. Summing nodes are also included. These block diagrams are generalized arrangements, and can, for example, be applied to specific types of arrangements such as that shown in FIG. 5 and FIG. 6, in which case the elements shuffled are the capacitors described hereinabove in connection with those figures.

In all of the methods described below it is assumed that the input is three, that is, $d_{in}=3$. This is merely an example used in these methods. In general, of course, $d_{in}$ may be anything within the range of the arrangement to which the method is to be applied. Thus, for an arrangement like that of FIGS. 5 and 6, $d_{in}$ can be anything from 0 to $2^{m-1}$, or 0 to $2_m$, depending on the pipelined architecture.

Figure 7:
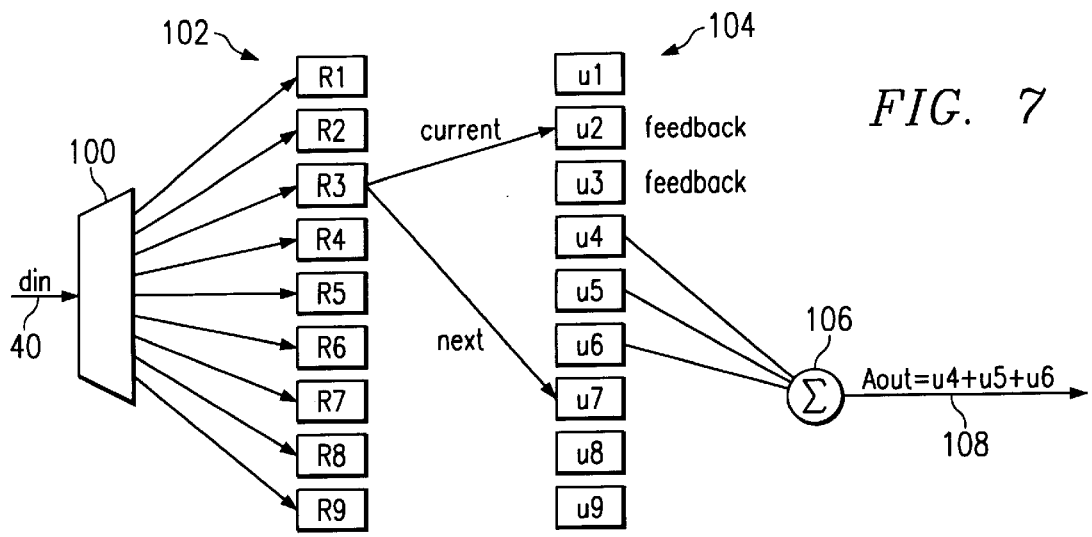
FIG. 7 is a block diagram of an arrangement in which a first preferred embodiment of the present invention is practiced.

Referring now to FIG. 7, the application of the inventive technique in a first preferred embodiment will now be described. In FIG. 7 can be seen a digital input line 40, carrying the digital output of the m-bit ADSC 36 for a sample period. The digital value on line 40 is used to select the arrangement of capacitors for the sample and hold amplifier 32 in the next following hold, or amplification phase as follows. The digital value on line 40, which in this case by example is $d_{in}=3$, is stored in a register 100 and used to select a register in a set of registers 102, comprising registers R1, R2, . . . R9, as shown. Each of the registers in the register set 102 stores a value pointing to an element in a stack of elements 104, identified by a cyclic sequence from one to nine, being cyclic in that as selections are made of these elements in the selection procedure, after the ninth element is selected in a sequence, the procedure simply wraps to the first element and continues. The stack of elements 104 thus comprises elements U1, U2, . . . U9, as shown. Each of the elements in element stack 104 corresponds to one of the capacitors C1, C2, . . . C9, on a one-to-one basis. Thus, element U1 corresponds to capacitor C1, element U2 corresponds to capacitor C2, and so forth. The element pointed to by the selected register is used in a decision about which switches to set in the present hold phase. Specifically, the switches corresponding to the element pointed to, and the next element in the stack 104, are switched such that their corresponding capacitors are selected as the feedback capacitors. The switches corresponding to the next three elements in the stack 104 are switched such that their corresponding capacitors are selected as the DASC capacitors. In the same sample period the register so used is updated by having the element pointer increased by a number equal to the sum of the number of feedback capacitors and the number of DASC capacitors. Each register in register set 102 is used and updated in this way.

Details of the operation of the methodology in FIG. 7 will now be described through the use of an example. In this example $d_{in}=3$, and so a digital code of three appears on line 40. Thus, register R3 is selected. As a result of earlier decisions, for example the loading into register R3 of an initial value, or the updating of the contents of register R3 as described above, R3 currently points to element U2 as the current element, as shown in FIG. 7. In this case, elements U2 and U3 are then automatically selected for switching such that their corresponding capacitors C2 and C3 are selected as the feedback capacitors. Thus, the element pointed to, plus the next element in the sequence form the feedback capacitors.

Elements U4, U5 and U6, which follow U3 in the sequence, are automatically selected such that their corresponding capacitors C4, C5 and C6 are used as the DASC capacitors connecting to $V_{REF}$ during the hold phase. Thus, the next number of elements following the feedback capacitors in the sequence, the number being the number provided as the input, din. The remaining capacitors C7, C8, C9 and C1 are automatically selected and switched to connect to $-V_{REF}$ during the hold phase.

The analog output $A_{out}$ is the conceptual output voltage of the DASC of the stage, i.e., the output 44 of the m-bit DASC 42 of FIG. 1, when the capacitors are configured in this way. This is true for all of the figures described below, as well.

Note that to maintain the procedure in continuous fashion, the selection wraps back to C1 after C9 is selected. The same wrapping applies in all of the embodiments described herein.

In the same sample period, register R3 is updated by five, representing two for the feedback capacitors, plus three for the DASC capacitors, to point to the next switch element U7, as shown. In this way, a kind of individual level averaging type noise shaping is performed in converting element mismatch to noise.

Regarding initialization of registers R1 through R9, all of these registers may be initialized to point to U1, although the specific pattern for initialization may vary, and is not critical. For example, R1 may be initialized to point to U1, while R2 is initialized to point to U2, R3 to U3, and so forth. The user may select any different pattern desired, all of which are considered to be within the scope of the invention. The same principles regarding initialization apply to the techniques described below.

Figure 8:
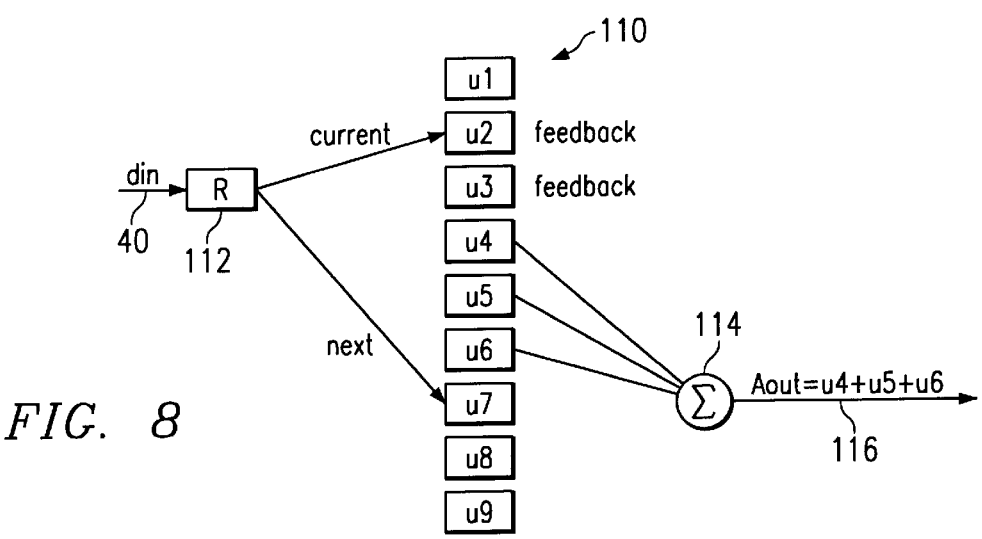
FIG. 8 is a block diagram of an arrangement in which a second preferred embodiment of the present invention is practiced.

Referring now to FIG. 8, the application of the inventive technique in a second preferred embodiment will now be described. The method is similar to the method described above in conjunction with FIG. 7 in that a stack of elements 110 is provided, comprising elements U1, U2, . . . U9, as shown, wherein each of the elements in element stack 110 corresponds to one of the capacitors C1, C2, . . . C9, on a one to one basis. However, in this method only one register 112 is provided to receive the digital input din on line 40. The digital value stored in register 112 points, as a result of earlier decisions, to U2, the first element in the stack 110 to be used to represent the DAC level. As in the previous example, the element pointed to by the selected register is used in a decision about which switches to set in the present hold phase. Specifically, the switches corresponding to the element pointed to, and the next element in the stack 110, U2 and U3, are switched such that their corresponding capacitors are selected as the feedback capacitors. Since din is three in this example, the switches corresponding to the next three elements in the stack 110, U4, U5 and U6, are switched such that their corresponding capacitors are selected as the DASC capacitors, connecting to $V_{REF}$ during the hold phase. The remaining capacitors, C7, C8, C9 and C1 are connected to $-V_{REF}$ during the hold phase. Register 112 is updated in the same sample period such that the element pointer is increased by a number equal to the sum of the number of feedback capacitors and the number of DASC capacitors, in this case to U7. Capacitor usage rotates accordingly.

Figure 9:
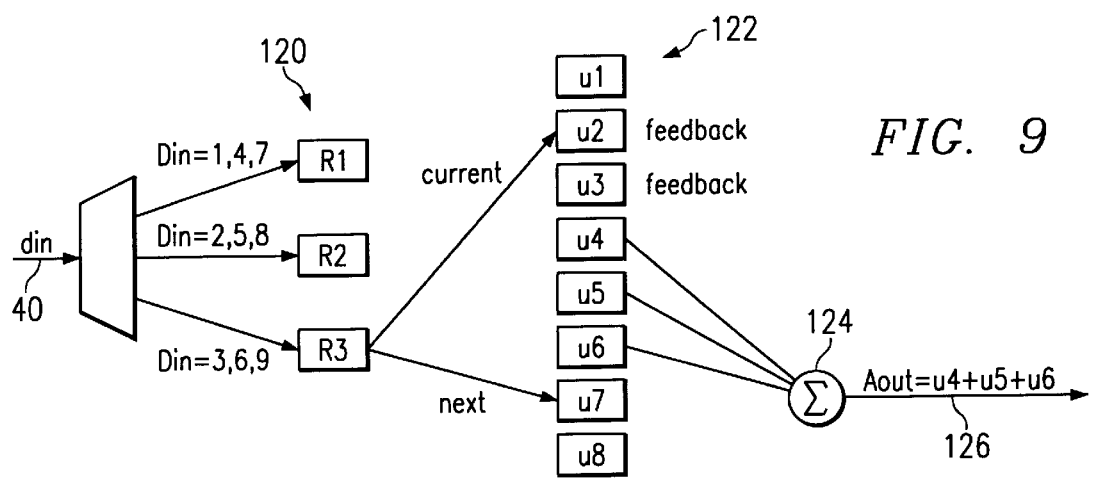
FIG. 9 is a block diagram of an arrangement in which a third preferred embodiment of the present invention is practiced.

Referring now to FIG. 9, the application of the inventive technique in a third preferred embodiment will now be described. In this third technique, group level averaging is performed to convert element mismatch to noise. The number of registers used is somewhere between the number used in the first technique and the number used in the second technique, described above. In the specific example shown in FIG. 9, the number of registers in a set of registers 120 is three. In this method, when the digital input $d_{in}$ on line 40 is equal to one, four, or seven, register R1 is selected. If the digital input $d_{in}$ is two, five, or eight, register R2 in set 120 is selected. If the digital input on line 40 $d_{in}$ is three, six, or nine, register R3 in set 120 is selected. As above, the contents of the register points to an element in the stack 122 of elements. The capacitor corresponding to that element, and the next element are selected as the feedback capacitors, with the next three being used as the DASC capacitors, as before, because $d_{in}$=3. Updating proceeds as before, as well.

Figure 10:
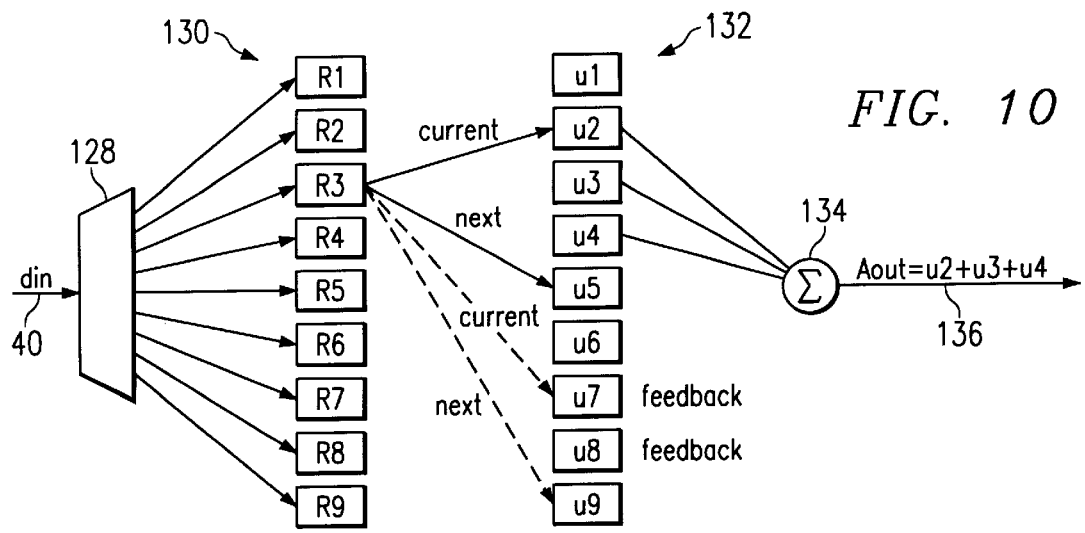
FIG. 10 is a block diagram of an arrangement in which a fourth preferred embodiment of the present invention is practiced.

Referring now to FIG. 10, the application of the inventive technique in a fourth preferred embodiment will now be described. First, it will be noted that in the first three techniques, described above, a single pointer is used to point to the next feedback element to be used. The first DAC capacitor is the one that immediately follows the feedback capacitors. However, if these techniques were to be applied to the 1.5b/stage architecture shown in FIG. 2, the feedback capacitor would never change, leaving the interstage gain error not averaged. For this reason, further methodologies are described herein, beginning with this fourth methodology. The basic concept is to have different pointers for the feedback and for the DAC capacitors. Thus, in FIG. 10, the digital value din on line 40 is used to select one register in a set of registers 130, wherein each register has two pointers stored therein rather than the single pointer in the methods described above. In the specific example depicted in FIG. 10, because $d_{in}$=3, register R3 is selected by the digital value $d_{in}$. Register R3, as a result of earlier decisions, points to element U7 to select capacitors C7 and C8 as the feedback capacitors. Also as a result of earlier decisions, it also points to element U2 to select capacitors C2, C3 and C4 as the DAC capacitors. In the same sample period that R3 is selected, both pointers in R3 are updated so that the first of the next two feedback capacitors selected is capacitor C9, and the first of the next three DAC capacitors to be used is capacitor C5, as shown.

Regarding initialization of the configuration shown in FIG. 10, the principles discussed above apply. Further, since each register stores two values, it may be desired to initially have the feedback pointers of R1 through R9 point to U1, while the DAC pointers of R1 through R9 point to U3. Again, the user may decide on a different initialization pattern, as desired, the particular initialization pattern not being critical to the invention.

Figure 11:
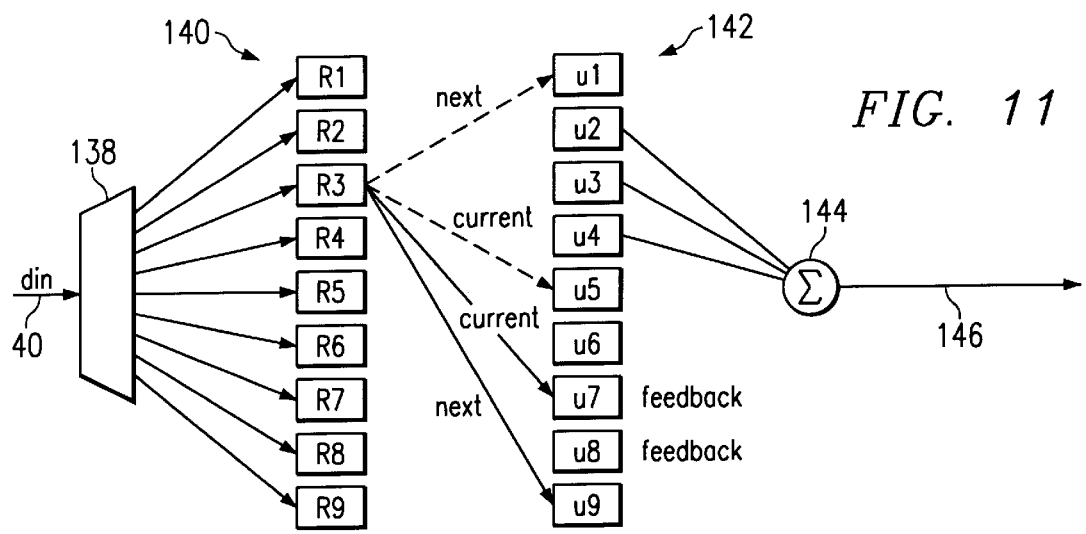
FIG. 11 is a block diagram of an arrangement in which a fifth preferred embodiment of the present invention is practiced.

Referring now to FIG. 11, the application of the inventive technique in a fifth preferred embodiment will now be described. This technique is similar to the fourth technique, described above in conjunction with FIG. 10, except that the feedback capacitor pointer has priority over the DAC capacitor pointer. In the example depicted in FIG. 11, the DAC and the feedback pointers are pointing at U5 and U7 respectively, resulting in capacitors C7 and C8 being the feedback capacitors, while capacitors C5, C6 and C9 are the DAC capacitors. Before the next sample period, the feedback and the DAC pointers are updated to U9 and U1, respectively.

Figure 12:
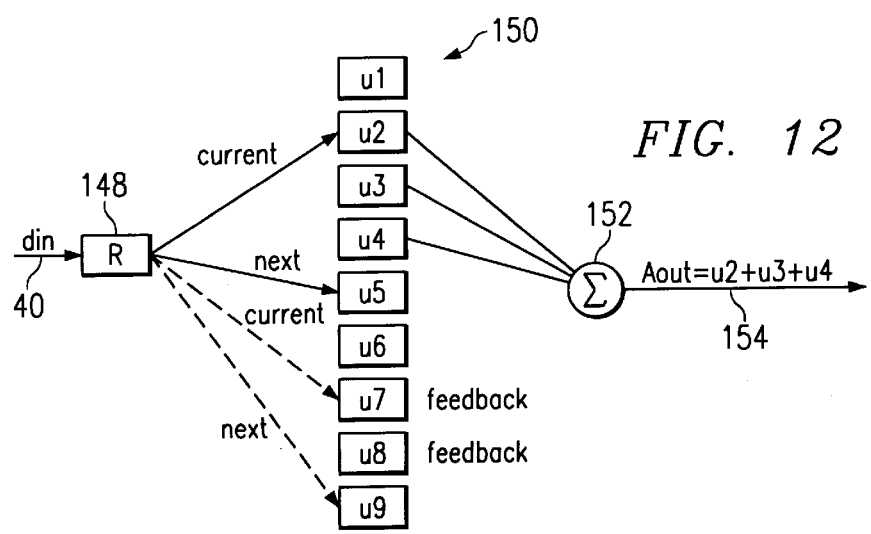
FIG. 12 is a block diagram of an arrangement in which a sixth preferred embodiment of the present invention is practiced.

Referring now to FIG. 12, the application of the inventive technique in a sixth preferred embodiment will now be described. In this embodiment, a single register 148 is used. As before, $d_{in}$=3. This technique is similar in some respects to the second embodiment, described above, except that two pointers are used. In the example depicted in FIG. 12, as a result of earlier decisions the current DAC pointer is pointing at U2, while the current feedback capacitor pointer is pointing at U7. Thus, since $d_{in}$=3 capacitors C2, C3 and C4 are the DAC capacitors, while capacitors C7 and C8 are the feedback capacitors. Before the next sample period, the DAC and feedback pointers are updated to U5 and U9, respectively. In addition, the DAC pointer has priority over the feedback capacitor pointer. For example, if register 148 is pointing at U5 for the DAC capacitors and at U7 for the feedback capacitors, the DAC capacitors selected are U5, U6 and U7 while the feedback capacitors selected are U8 and U9, the closest available capacitors to the pointer at U7.

Figure 13:
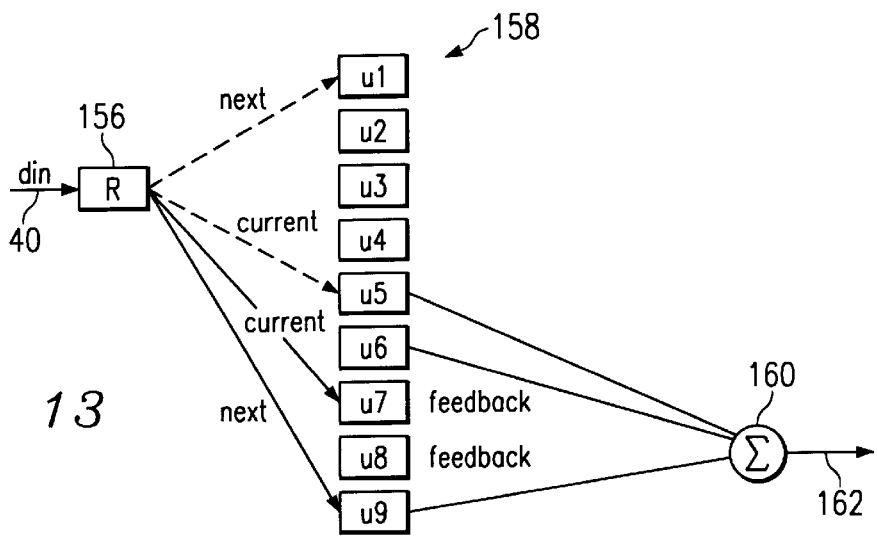
FIG. 13 is a block diagram of an arrangement in which a seventh preferred embodiment of the present invention is practiced.

Referring now to FIG. 13, the application of the inventive technique in a seventh preferred embodiment will now be described. As before, $d_{in}$=3. This technique is similar to the technique just described, except that the feedback capacitor pointer has priority over the DAC pointer. Thus, in the example depicted in FIG. 13, register 156 is pointing at U5 at the DAC capacitors, and to U7 for the feedback capacitors. The DAC capacitors thus selected are C5, C6 and C9 while the feedback capacitors selected are C7 and C8.

Figure 14:
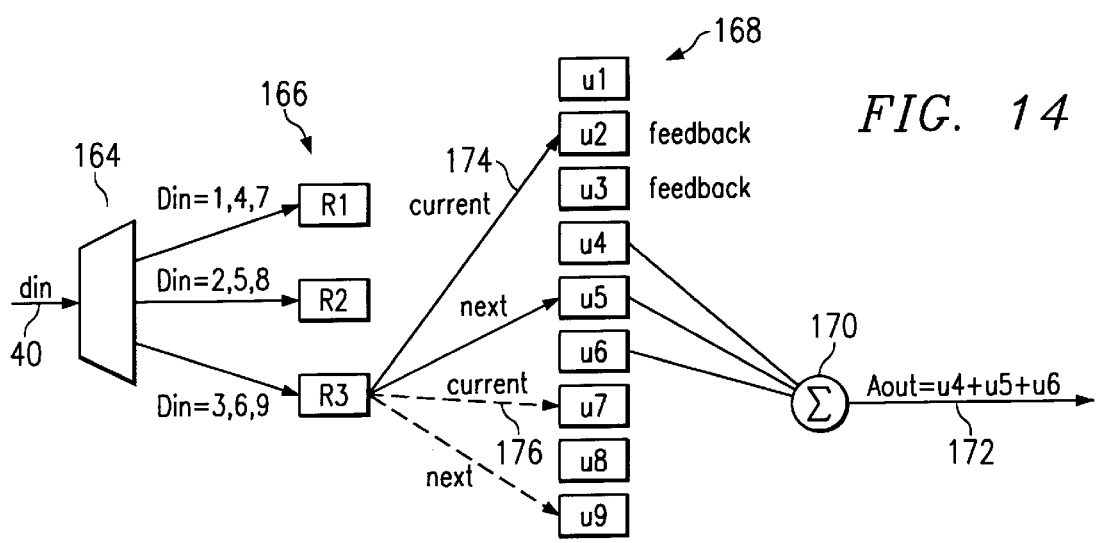
FIG. 14 is a block diagram of an arrangement in which a eighth preferred embodiment of the present invention is practiced.

Referring now to FIG. 14, the application of the inventive technique in an eighth preferred embodiment will now be described. This technique is similar to the third preferred embodiment described above, except that two pointers are used. In the example shown in FIG. 14, when the digital input $d_{in}$ is equal to 1, 4 or 7, register R1 in the set of registers 166 is selected. When the digital in put $d_{in}$ is 2, 5 or 8, register R2 is selected, while when din is equal to 3, 6 or 9, register R3 is selected. In the specific example depicted in FIG. 14, because din is 3, register R3 is selected. Since the DAC and the feedback capacitor pointers are pointing at U2 and U7, respectively, capacitors C2, C3 and C4 are selected as the DAC capacitors, while C7 and C8 are selected as the feedback capacitors. The DAC and feedback capacitor pointers are updated to U5 and U9, respectively. The solid line for the DAC pointer 174 indicates that it has priority over the feedback capacitor pointer 176.

Figure 15:
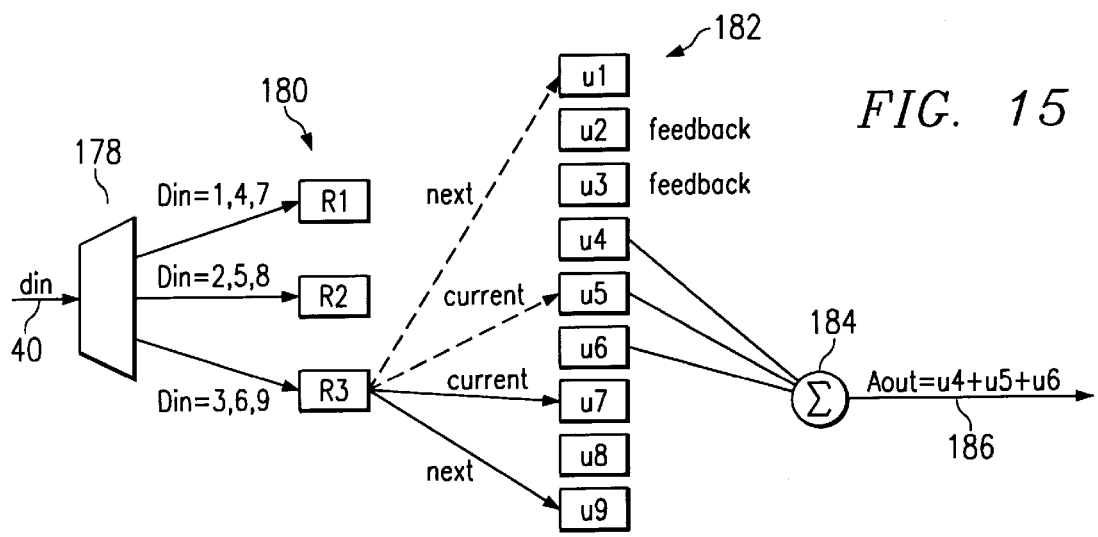
FIG. 15 is a block diagram of an arrangement in which a ninth preferred embodiment of the present invention is practiced.

Referring now to FIG. 15, the application of the inventive technique in a ninth preferred embodiment will now be described. This technique is similar to the technique just described, except that the feedback pointer has priority over the DAC pointer. In this specific example depicted in FIG.

15, the digital input $d_{in}$ is 3, and thus register R3 is selected. Since the feedback capacitor pointer points at U7, capacitors C7 and C8 are selected as the feedback capacitors. The feedback capacitor pointer is updated to U9. Since the feedback capacitor pointer has priority over the DAC pointer, capacitors C5, C6 and C9 are selected as the DAC capacitors. The DAC pointer is updated to U1.

Note that in any of the methods described herein it is possible that repetitive patterns might give rise to tones being generated. If that occurs, a kind of dithering may be used to address this problem. To add dithering, it is simply provided that the pointer shifts by one element randomly so as to destroy such repetitive patterns.

Note also that all of the embodiments described above are compatible with any standard digital error correction techniques, and can be applied to single or multibit per stage pipelined architectures.

Finally, note that the circuits shown in FIGS. 2, 3, 5 and 6 are single ended, for ease of explanation. The principles are the same for circuits that are fully differential, and the considerations involved in implementing the present invention are essentially the same as those discussed herein, with the considerations applying to both differential paths, rather than to only the one path in a single-ended circuit.

In fact, it will be appreciated that the principles of the present invention may be implemented in many architectures, other than that shown in the foregoing figures. What makes utilization of the present invention possible is the use of multiple capacitors, designed to be the same value, and that are alternated between a sampling configuration and an amplifying configuration, as will be apparent after understanding the principles set forth herein.

Finally, note that the circuits shown in FIGS. 2, 3, 5 and 6 are single ended, for ease of explanation. The principles are the same for circuits that are fully differential, and the considerations involved in implementing the present invention are essentially the same as those discussed herein, with the considerations applying to both differential paths, rather than to only the one path in a single-ended circuit.

Although the present invention and its advantages have been described in detail it should be understood that various changes, substitutions and alterations can be made herein without departing from the spirit and scope of the invention as defined by the appended claims.

What is claimed is:

1. A method for shuffling capacitors from sample period to sample period in a stage of a multi-stage analog to digital converter ("ADC"), the ADC stage receiving for each sample period an input having a first analog voltage level, and providing for each sample period a digital output representing a second voltage level corresponding to said first analog voltage level to a predetermined digital accuracy and providing an analog output representative of the difference between said first analog voltage level and a second analog voltage level corresponding to said digital output, said ADC stage including a plurality of capacitors usable for storage of charge during a sample phase and for providing during an amplification phase, in conjunction with an amplifier, an output signal having a voltage representing the difference between said second analog voltage level and said first analog voltage level, comprising the steps of:

providing said input to said plurality of capacitors during said sample phase to capture and hold said first analog voltage level at a first time in said sample phase;

using a selected sub-group of said plurality of capacitors as feedback capacitors and using a remaining sub-group of said plurality of capacitors as digital to analog subconverter ("DASC") capacitors, said selected sub-group and said remaining sub-group being different sets in adjacent sample periods, in conjunction with said amplifier, in accordance with a predetermined capacitor shuffling procedure adapted to convert resulting harmonic distortion associated with capacitor mismatch into noise having a spectral amplitude peak placed outside of a predetermined spectral band.

2. A method in accordance with claim 1, wherein said predetermined capacitor shuffling procedure comprises the following steps:

for a first sample period, using said digital output for said first sample period to select, based on a first stored selection associated with the value of said digital output for said first sample period, a first sub-group of said plurality of capacitors, contiguous in said sequence, as said selected sub-group and using said first sub-group as feedback capacitors, using said digital output for said first sample period to select, based on a second stored selection associated with the value of said digital output for said first sample period, a second sub-group of capacitors in said sequence as said remaining sub-group as DASC capacitors, the number of capacitors in said second sub-group being determined by said digital output for said first sample period, updating said first stored selection associated with the value of said digital output for said first sample period to the next capacitor in said sequence after the last of said first sub-group of capacitors, and updating said second stored selection associated with the value of said digital output for said first sample period to the next capacitor in said sequence after the last of said second sub-group of capacitors; and for a subsequent sample period, using said digital output for said subsequent sample period to select, based on a third stored selection associated with the value of said digital output for said subsequent sample period, a third sub-group of said plurality of capacitors, contiguous in said sequence, as said selected sub-group and using said third sub-group as feedback capacitors, using said digital output for said subsequent sample period to select, based on a second stored selection associated with the value of said digital output for said first sample period, a fourth sub-group of capacitors in said sequence as said remaining sub-group as DASC capacitors, the number of capacitors in said fourth sub-group being determined by said digital output for said subsequent sample period, updating said third stored selection associated with the value of said digital output for said subsequent sample period to the next capacitor in said sequence after the last of said third sub-group of capacitors, and updating said fourth stored selection associated with the value of said digital output for said subsequent sample period to the next capacitor in said sequence after the last of said fourth sub-group of capacitors.

3. A method in accordance with claim 2, wherein, in the selection of capacitors for a sub-group during any sample period, the capacitors selected for use as feedback capacitors have priority over capacitors selected for use as DASC capacitors, such that, when selection conflict exists, capacitors in said sequence following capacitors selected for use as feedback capacitors are selected for DASC capacitors subject to said conflict.

4. A method in accordance with claim 1, wherein said predetermined capacitor shuffling procedure comprises the following steps:

for a first sample period,
selecting, based on a first stored selection, a first sub-group of said plurality of capacitors, contiguous in said sequence, as said selected sub-group and using said first sub-group as feedback capacitors,
selecting, based on a second stored selection, a second sub-group of capacitors as DASC capacitors, the number of capacitors in said second sub-group being determined by said digital output for said first sample period,
updating said first stored selection to the next capacitor in said sequence after the last of said first sub-group of capacitors,
updating said second stored selection to the next capacitor in said sequence after the last of said second sub-group of capacitors; and for a subsequent sample period,
selecting, based on said first stored selection, a third sub-group of said plurality of capacitors, contiguous in said sequence, as said selected sub-group and using said third sub-group as feedback capacitors,
selecting, based on said second stored selection, a fourth sub22 group of capacitors as DASC capacitors, the number of capacitors in said fourth sub-group being determined by said digital output for said subsequent sample period,
updating said first stored selection to the next capacitor in said sequence after the last of said third sub-group of capacitors, and
updating said second stored selection to the next capacitor in said sequence after the last of said fourth sub-group of capacitors.

5. A method in accordance with claim 4, wherein, in the selection of capacitors for a sub-group during any sample period, the capacitors selected for use as feedback capacitors have priority over capacitors selected for use as DASC capacitors, such that, when selection conflict exists, capacitors in said sequence following capacitors selected for use as feedback capacitors are selected for DASC capacitors subject to said conflict.

6. A method in accordance with claim 1, wherein said predetermined capacitor shuffling procedure comprises the following steps: uniquely identifying each capacitor in said plurality of capacitors in a cyclic sequence;

for a first sample period,
using said digital output for said first sample period to select, based on a first stored selection associated with a first group of values of said digital output including the value for said first sample period, a first sub-group of said plurality of capacitors, contiguous in said sequence, as said selected sub-group and using said first sub-group as feedback capacitors,
using said digital output for said first sample period to select, based on a second stored selection associated with said first group of values of said digital output including the value for said first sample period, a second sub-group of capacitors as said remaining sub-group as DASC capacitors, the number of capacitors in said second sub-group being determined by said digital output for said first sample period, and using said second sub-group of capacitors as DASC capacitors,
updating said first stored selection associated with said group of values of said digital output including the value of said digital output for said first sample period to the next capacitor in said sequence after the last of said first sub-group of capacitors, and
updating said second stored selection associated with said group of values of said digital output including the value of said digital output for said first sample period to the next capacitor in said sequence after the last of said second sub-group of capacitors; and for a subsequent sample period,
using said digital output for said subsequent sample period to select, based on a second stored selection associated with a second group of values of said digital output including the value for said subsequent sample period, a third sub-group of said plurality of capacitors, contiguous in said sequence, as said selected sub-group and using said third sub-group as feedback capacitors,
using said digital output for said subsequent sample period to select, based on a fourth stored selection associated with said second group of values of said digital output including the value for said subsequent sample period, a fourth sub-group of capacitors as said remaining sub-group as DASC capacitors, the number of capacitors in said fourth sub-group being determined by said digital output for said subsequent sample period, and using said fourth sub-group of capacitors as DASC capacitors,
updating said third stored selection associated with said group of values of said digital output including the value of said digital output for said subsequent sample period to the next capacitor in said sequence after the last of said third sub-group of capacitors, and
updating said fourth stored selection associated with said group of values of said digital output including the value of said digital output for said subsequent sample period to the next capacitor in said sequence after the last of said fourth sub-group of capacitors.

7. A method in accordance with claim 6, wherein, in the selection of capacitors for a sub-group during any sample period, the capacitors selected for use as feedback capacitors have priority over capacitors selected for use as DASC capacitors, such that, when selection conflict exists, capacitors in said sequence following capacitors selected for use as feedback capacitors are selected for DASC capacitors subject to said conflict.

8. A method in accordance with claim 1, wherein said predetermined capacitor shuffling procedure comprises the following steps:
uniquely identifying each capacitor in said plurality of capacitors in a cyclic sequence;
for a first sample period,
using said digital output for said first sample period to select, based on a first stored selection associated with the value of said digital output for said first sample period, a first sub-group of said plurality of capacitors, contiguous in said sequence, as said selected sub-group and using said first sub-group as feedback capacitors,
using a second sub-group of capacitors, immediately following said first sub-group of feedback capacitors in said sequence as said remaining sub-group as DASC capacitors, the number of capacitors in said second sub-group being determined by said digital output for said first sample period;

updating said first stored selection associated with the value of said digital output for said first sample period to the next capacitor in said sequence after the last of said sub-group of capacitors; and for a subsequent sample period,
using said digital output for said subsequent sample period to select, based on a second stored selection associated with the value of said digital output for said subsequent sample period, a third sub-group of said plurality of capacitors, contiguous in said sequence, as said selected sub-group and using said third sub-group as feedback capacitors, using a fourth sub-group of capacitors, immediately following said third sub-group of feedback capacitors in said sequence as said remaining sub-group as DASC capacitors, the number of capacitors in said third sub-group being determined by said digital output for said subsequent sample period; and updating said second stored selection associated with the value of said digital output for said subsequent sample period to the next capacitor in said sequence after the last of said fourth sub-group of capacitors.

9. A method in accordance with claim 1, wherein said predetermined capacitor shuffling procedure comprises the following steps:

uniquely identifying each capacitor in said plurality of capacitors in a cyclic sequence;

for a first sample period,
selecting, based on a stored selection, a first sub-group of said plurality of capacitors, contiguous in said sequence, as said selected sub-group and using said first sub-group as feedback capacitors, using a second sub-group of capacitors, immediately following said first sub-group of feedback capacitors in said sequence as said remaining sub-group as DASC capacitors, the number of capacitors in said second sub-group being determined by said digital output for said first sample period, and using said second sub-group of capacitors as DASC capacitors, and updating said stored selection to the next capacitor in said sequence after the last of said sub-group of capacitors; and for a subsequent sample period,
selecting, based on said stored selection, a third sub-group of said plurality of capacitors, contiguous in said sequence, as said selected sub-group and using said third sub-group as feedback capacitors, using a fourth sub-group of capacitors, immediately following said third sub-group of feedback capacitors in said sequence as said remaining sub-group as DASC capacitors, the number of capacitors in said third sub-group being determined by said digital output for said subsequent sample period, and using said fourth sub-group of capacitors as DASC capacitors, and updating said stored selection to the next capacitor in said sequence after the last of said fourth sub-group of capacitors.

10. A method in accordance with claim 1, wherein said predetermined capacitor shuffling procedure comprises the following steps:

uniquely identifying each capacitor in said plurality of capacitors in a cyclic sequence;

for a first sample period,
using said digital output for said first sample period to select, based on a first stored selection associated with a first group of values of said digital output including the value for said first sample period, a first sub-group of said plurality of capacitors, contiguous in said sequence, as said selected sub-group and using said first sub-group as feedback capacitors, using a second sub-group of capacitors, immediately following said first sub-group of feedback capacitors in said sequence as said remaining sub-group as DASC capacitors, the number of capacitors in said second sub-group being determined by said digital output for said first sample period, and updating said first stored selection associated with said group of values of said digital output including the value of said digital output for said first sample period to the next capacitor in said sequence after the last of said sub-group of capacitors; and for a subsequent sample period,
using said digital output for said subsequent sample period to select, based on a second stored selection associated with a second group of values of said digital output including the value of said digital output for said subsequent sample period, a third sub-group of said plurality of capacitors, contiguous in said sequence, as said selected sub-group and using said third sub-group as feedback capacitors, using a fourth sub-group of capacitors, immediately following said third sub-group of feedback capacitors in said sequence as said remaining sub-group as DASC capacitors, the number of capacitors in said third sub-group being determined by said digital output for said subsequent sample period, and updating said second stored selection associated with said second group of values of said digital output including the value of said digital output for said subsequent sample period to the next capacitor in said sequence after the last of said fourth sub-group of capacitors.

* * * * *